(12) United States Patent
Nakajiki et al.

(10) Patent No.: US 8,779,541 B2
(45) Date of Patent: Jul. 15, 2014

(54) SOLID-STATE IMAGING DEVICE WITH PIXELS HAVING WHITE FILTER, MICROLENS AND PLANARIZING FILM REFRACTIVE INDICES IN PREDETERMINED RELATIONSHIP

(71) Applicant: Sony Corporation, Tokyo (JP)

(72) Inventors: Sintaro Nakajiki, Kumamoto (JP); Yukihiro Sayama, Kumamoto (JP); Yuichi Seki, Kumamoto (JP); Masanori Harasawa, Kumamoto (JP); Yoshinori Toumiya, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/679,334

(22) Filed: Nov. 16, 2012

(65) Prior Publication Data

US 2013/0134537 A1    May 30, 2013

(30) Foreign Application Priority Data

Nov. 30, 2011 (JP) ................................. 2011-262102

(51) Int. Cl.
*H01L 31/0232* (2014.01)
*H01L 31/00* (2006.01)
*H01L 27/146* (2006.01)
*G02B 5/20* (2006.01)
*G02B 3/00* (2006.01)
*G02B 5/22* (2006.01)

(52) U.S. Cl.
CPC .... *H01L 27/14627* (2013.01); *H01L 27/14685* (2013.01); *H01L 27/14621* (2013.01); *G02B 5/201* (2013.01); *G02B 3/0018* (2013.01); *H01L 27/14683* (2013.01); *G02B 5/223* (2013.01)

USPC .................. 257/432; 257/440; 257/E31.121; 257/E31.122; 257/E31.123

(58) Field of Classification Search
IPC ................ H01L 27/14621, 27/14627, 27/14645, H01L 27/14667
See application file for complete search history.

(56) References Cited

U.S. PATENT DOCUMENTS

| | | | | |
|---|---|---|---|---|
| 5,239,412 A * | 8/1993 | Naka et al. | ..................... | 359/619 |
| 5,682,180 A * | 10/1997 | Young et al. | ................... | 345/589 |
| 6,867,838 B2 * | 3/2005 | Rho | .............................. | 349/139 |
| 7,084,472 B2 * | 8/2006 | Fukuyoshi et al. | ........... | 257/432 |
| 7,531,790 B2 * | 5/2009 | Lee et al. | ...................... | 250/226 |
| 7,656,453 B2 * | 2/2010 | Nishi | ............................ | 348/340 |
| 7,683,388 B2 * | 3/2010 | Mori | ............................... | 257/89 |
| 7,714,401 B2 * | 5/2010 | Nagase et al. | ................ | 257/431 |
| 8,395,686 B2 * | 3/2013 | Tatani et al. | .................. | 348/302 |

(Continued)

FOREIGN PATENT DOCUMENTS

| | | |
|---|---|---|
| JP | 2009-026808 | 2/2009 |
| JP | 2009-081169 | 4/2009 |

*Primary Examiner* — Ida M Soward
(74) *Attorney, Agent, or Firm* — Dentons US LLP

(57) ABSTRACT

A solid-state imaging device including a plurality of pixels arranged two-dimensionally, wherein each of the pixels has at least a planarizing film formed on the upper side of a photo-electric conversion element, a filter formed on the upper side of the planarizing film, and a microlens formed on the upper side of the filter. The filter of some of the pixels is a color filter permitting transmission therethrough of light of a predetermined color component, whereas the filter of other pixels is a white filter permitting transmission therethrough of light in the whole visible spectral range. The refractive indices of the white filter, the microlens and the planarizing film have the following relationship: (Refractive index of white filter)≥(Refractive index of microlens)>(Refractive index of planarizing film).

7 Claims, 11 Drawing Sheets

(56) References Cited

U.S. PATENT DOCUMENTS

| | | | |
|---|---|---|---|
| 2008/0265349 A1* | 10/2008 | Kasano et al. | 257/432 |
| 2009/0021629 A1* | 1/2009 | Yamada | 348/311 |
| 2010/0201834 A1* | 8/2010 | Maruyama et al. | 348/222.1 |
| 2010/0244169 A1* | 9/2010 | Maeda et al. | 257/432 |
| 2011/0043735 A1* | 2/2011 | Kozuma et al. | 349/106 |
| 2011/0204467 A1* | 8/2011 | Ohchi et al. | 257/443 |

* cited by examiner

PRIOR ART  F I G . 1
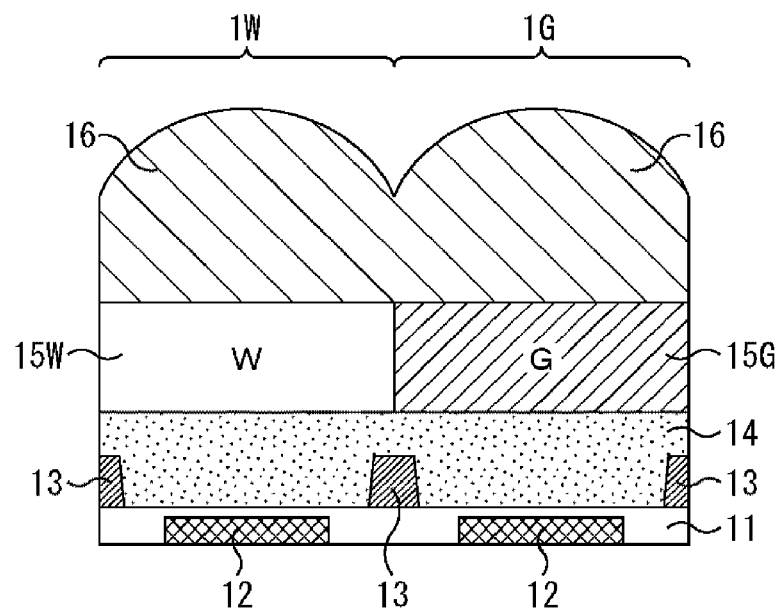
F I G . 2
PRIOR ART
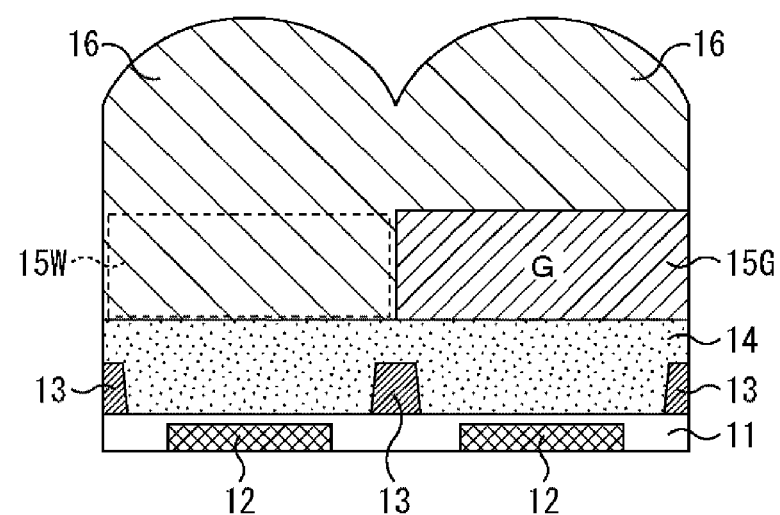

F I G . 5
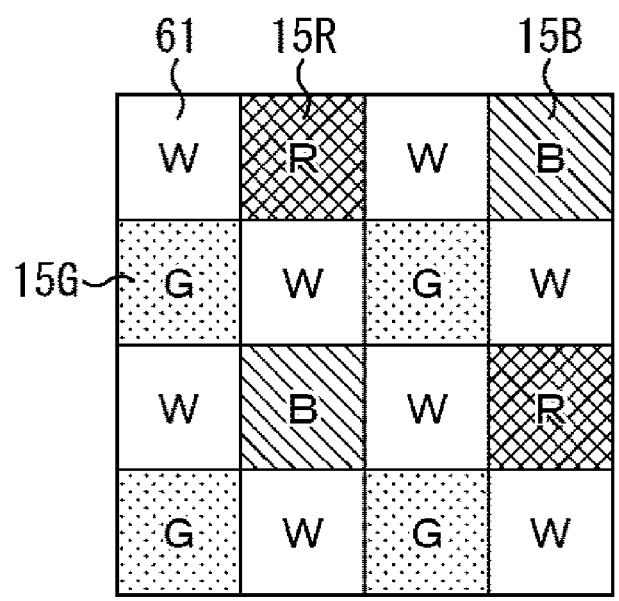

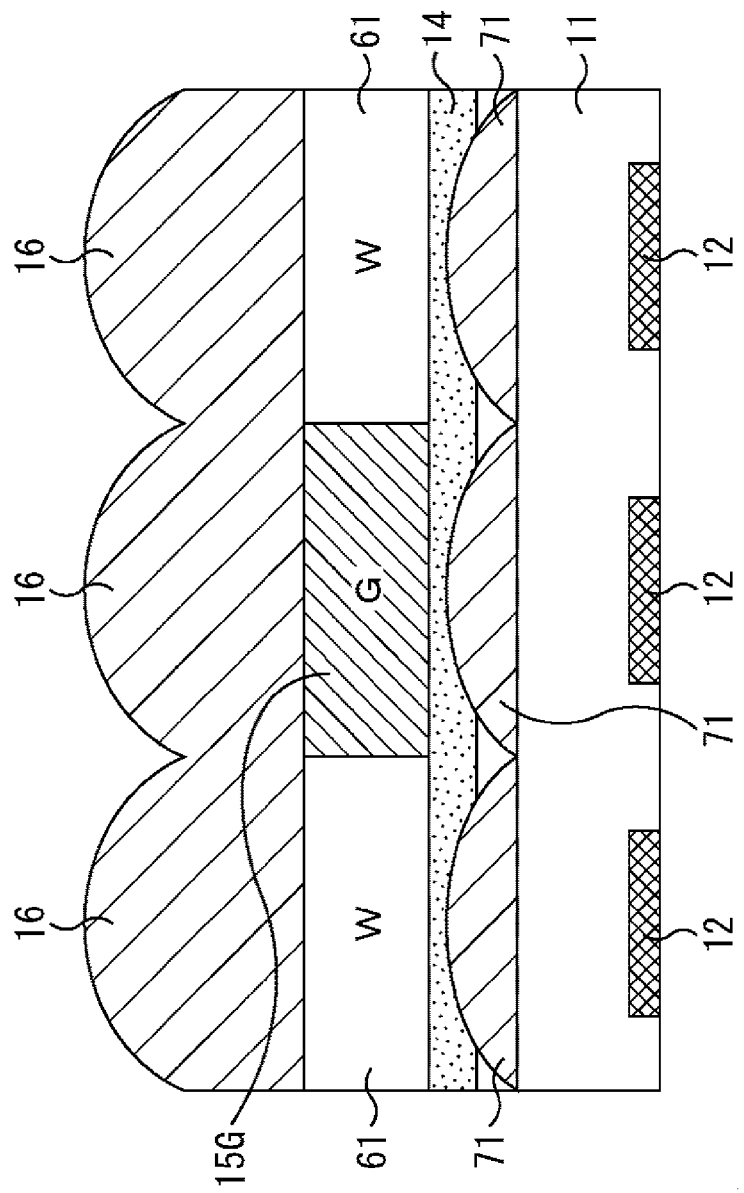

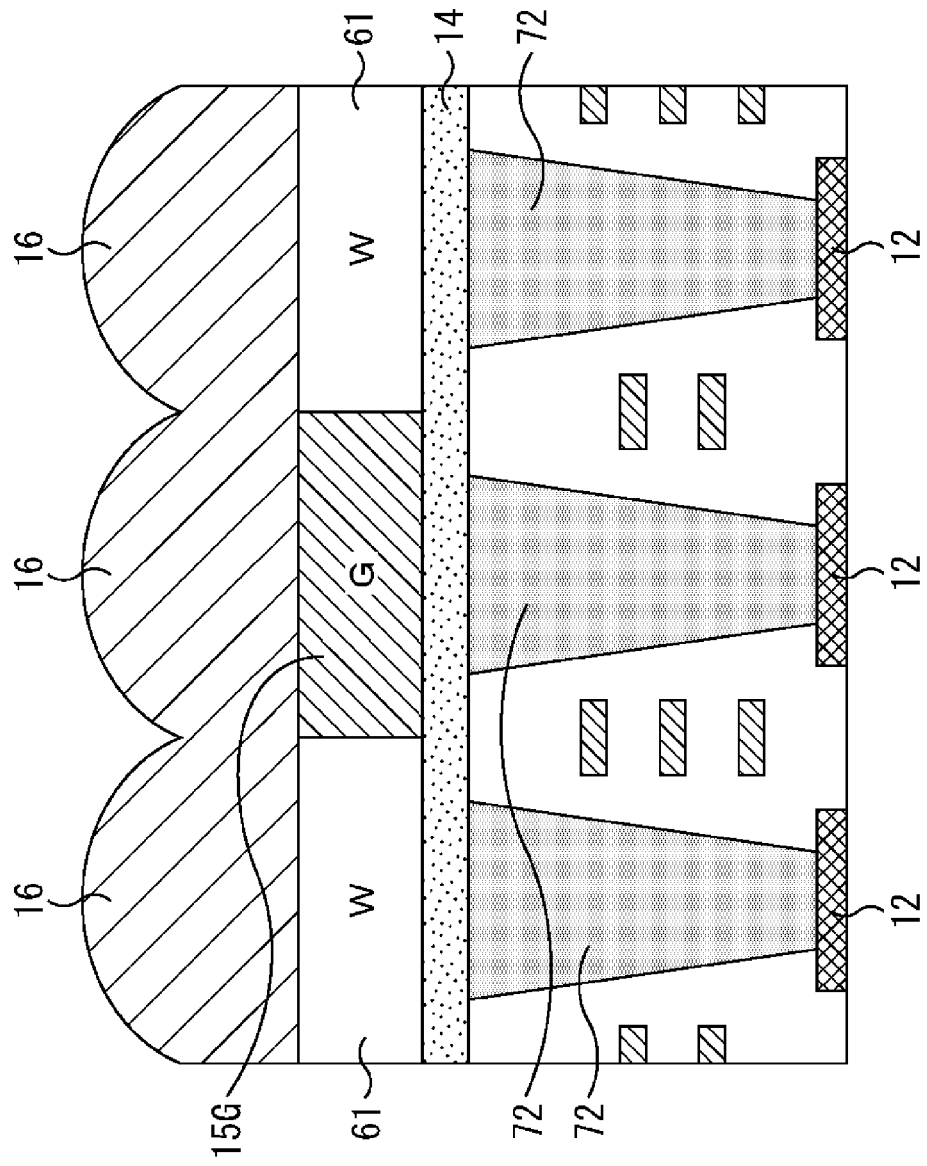

SOLID-STATE IMAGING DEVICE WITH PIXELS HAVING WHITE FILTER, MICROLENS AND PLANARIZING FILM REFRACTIVE INDICES IN PREDETERMINED RELATIONSHIP

BACKGROUND

The present technology relates to a solid-state imaging device and a manufacturing method therefor, an electronic apparatus, and a composition for a solid-state imaging device. More specifically, the present technology relates to a solid-state imaging device and a manufacturing method therefor, an electronic apparatus, and a composition for a solid-state imaging device by which optical color mixing can be suppressed and color reproduction properties can be enhanced.

In solid-state imaging devices such as CCD (charge coupled device) and CMOS (complementary metal oxide semiconductor) image sensors, there has been a tendency toward an increased number of pixels and toward a gradually reduced pixel size. When the pixel size is reduced to a certain extent, sensitivity characteristic per pixel would be lowered, making it difficult to obtain a necessary sensitivity.

In view of this problem, a technology has been known in which sensitivity is enhanced by providing pixels permitting transmission therethrough of light in the whole visible spectral range (these pixels will be referred to as W pixels), in addition to the ordinary R (red) pixels, G (green) pixels and B (blue) pixels (refer to, for example, Japanese Patent Laid-open No. 2009-26808 and Japanese Patent Laid-open No. 2009-81169, hereinafter referred to as Patent Document 1 and Patent Document 2, respectively).

The configuration of the W pixel in the related art will now be described referring to FIGS. 1 and 2.

FIG. 1 shows an example of sectional configuration of a W pixel 1W and a G pixel 1G adjacent thereto in a solid-state imaging device according to a related art.

As shown in FIG. 1, on a semiconductor substrate 11 such as silicon substrate, light receiving regions 12 such as photodiodes are formed on the basis of each of pixels 1 (W pixels 1W, G pixels 1G). A light blocking film 13 is formed on the semiconductor substrate 11 in the boundary regions between the pixels 1, and a planarizing film 14 is formed thereon. Then, on the planarizing film 14, a white filter 15W is formed in the region of each W pixel 1W, whereas a G color filter 15G is formed in the region of each G pixel 1G. Here, the white filter 15W is formed by use of a material which does not contain a pigment or dye as a color component for the R, G or B color filter 15. Subsequently, microlenses 16 are formed on the white filter 15W and the color filter 15G.

Thus, in connection with the solid-state imaging devices in the related art, there is a method wherein white filters not containing a pigment or dye as an R, G or B color component are formed in place of existing color filters to thereby form W pixels.

FIG. 2 shows another example of the configuration of W pixels.

In this another configuration example of the W pixel, the material of the microlenses formed on the color filters is embedded as white filters to thereby form W pixels. Thus, as shown in FIG. 2, the white filter 15W of the W pixel 1W is formed by use of the same material as that for the microlenses 16.

SUMMARY

However, in the W pixel configurations as shown in FIGS. 1 and 2, there has been the problem of easy occurrence of optical color mixing due to the differences in refractive index between the white filter and the R, G and B color filters. Specifically, as for example shown in FIG. 3, the light 21 to be originally taken into the W pixel 1W may fail to be deflected within the white filter 15W, and may consequently be taken into the adjacent G pixel 1G. Similarly, the light to be taken into the G pixel 1G may undesirably be taken into the adjacent W pixel 1W. As a result, in the W pixel configurations according to the related art, color reproduction properties have often been lowered.

Thus, there has been a need for suppression of optical color mixing and for enhanced color reproduction properties.

According to an embodiment of the present technology, there is provided a solid-state imaging device including a plurality of pixels arranged two-dimensionally, wherein the pixels each have at least a planarizing film formed on the upper side of a photoelectric conversion element, a filter formed on the upper side of the planarizing film, and a microlens formed on the upper side of the filter; the filters of a part of the pixels are each a color filter permitting transmission therethrough of light of a predetermined color component, whereas the filters of another part of the pixels are each a white filter permitting transmission therethrough of light in the whole visible spectral range; and the refractive indices of the white filter, the microlens and the planarizing film are in the following relationship: (Refractive index of white filter)≥(Refractive index of microlens)>(Refractive index of planarizing film).

According to another embodiment of the present technology, there is provided a method of manufacturing a solid-state imaging device which includes a plurality of pixels arranged two-dimensionally, the pixels each having at least a planarizing film formed on the upper side of a photoelectric conversion element, a filter formed on the upper side of the planarizing film, and a microlens formed on the upper side of the filter, and in which the filters of a part of the pixels are each a color filter permitting transmission therethrough of light of a predetermined color component, whereas the filters of another part of the pixels are each a white filter permitting transmission therethrough of light in the whole visible spectral range, the method including forming the pixels by using as materials for the planarizing film, the white filter and the microlens those materials which satisfy the following relationship: (Refractive index of white filter)≥(Refractive index of microlens)>(Refractive index of planarizing film).

According to a further embodiment of the present technology, there is provided an electronic apparatus including a solid-state imaging device, the solid-state imaging device including a plurality of pixels arranged two-dimensionally, wherein the pixels each have at least a planarizing film formed on the upper side of a photoelectric conversion element, a filter formed on the upper side of the planarizing film, and a microlens formed on the upper side of the filter; the filters of a part of the pixels are each a color filter permitting transmission therethrough of light of a predetermined color component, whereas the filters of another part of the pixels are each a white filter permitting transmission therethrough of light in the whole visible spectral range; and the refractive indices of the white filter, the microlens and the planarizing film are in the following relationship: (Refractive index of white filter)≥(Refractive index of microlens)>(Refractive index of planarizing film).

According to yet another embodiment of the present technology, there is provided a composition for a solid-state imaging device, the composition containing a copolymer resin, a metallic compound and a UV, ultra-violet absorber, having a refractive index at a wavelength of 500 nm in the range of 1.54 to 2.00, and permitting transmission therethrough of light in the whole visible spectral range.

According to the above-mentioned embodiments of the present technology, optical color mixing can be suppressed and color reproduction properties can be enhanced.

BRIEF DESCRIPTION OF THE DRAWINGS

FIG. 1 shows the configuration of a W pixel in a related art;
FIG. 2 shows the configuration of a W pixel in the related art;
FIG. 5 shows an example of arrangement of white filters;
FIG. 9 shows a sectional view of a solid-state imaging device with a structure having intra-layer lenses;
FIG. 10 shows a sectional view of a solid-state imaging device with a structure having waveguide structures.

DETAILED DESCRIPTION OF THE PREFERRED EMBODIMENT

General Configuration of Solid-State Imaging Device

Figure 3:
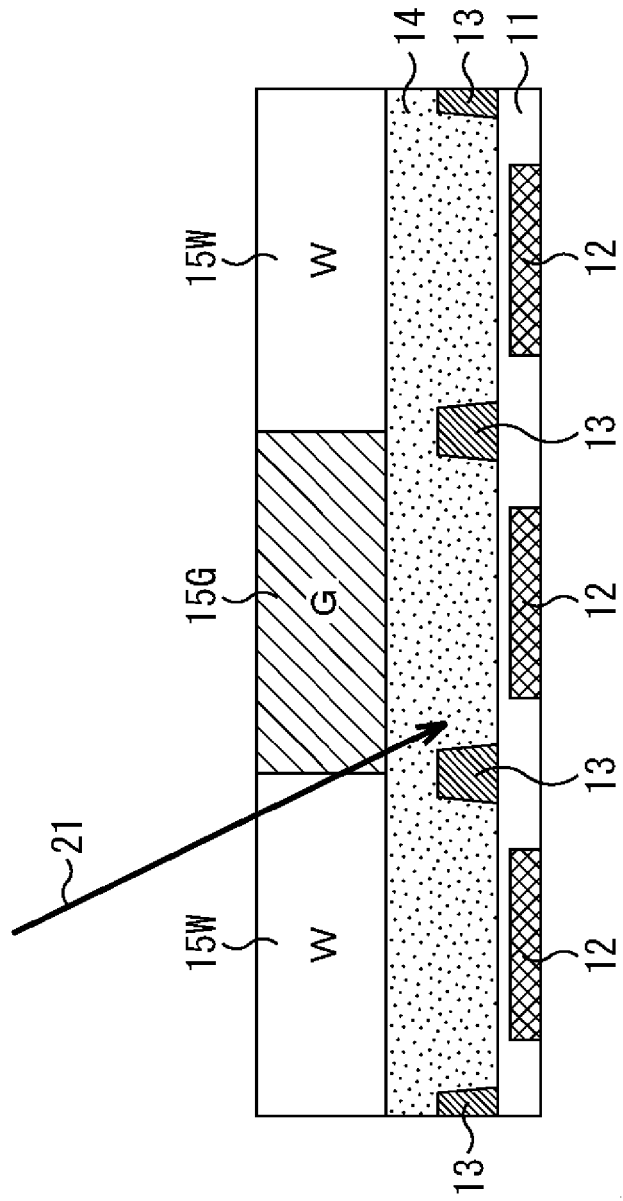
FIG. 3 illustrates a problem in the related art.
Figure 4:
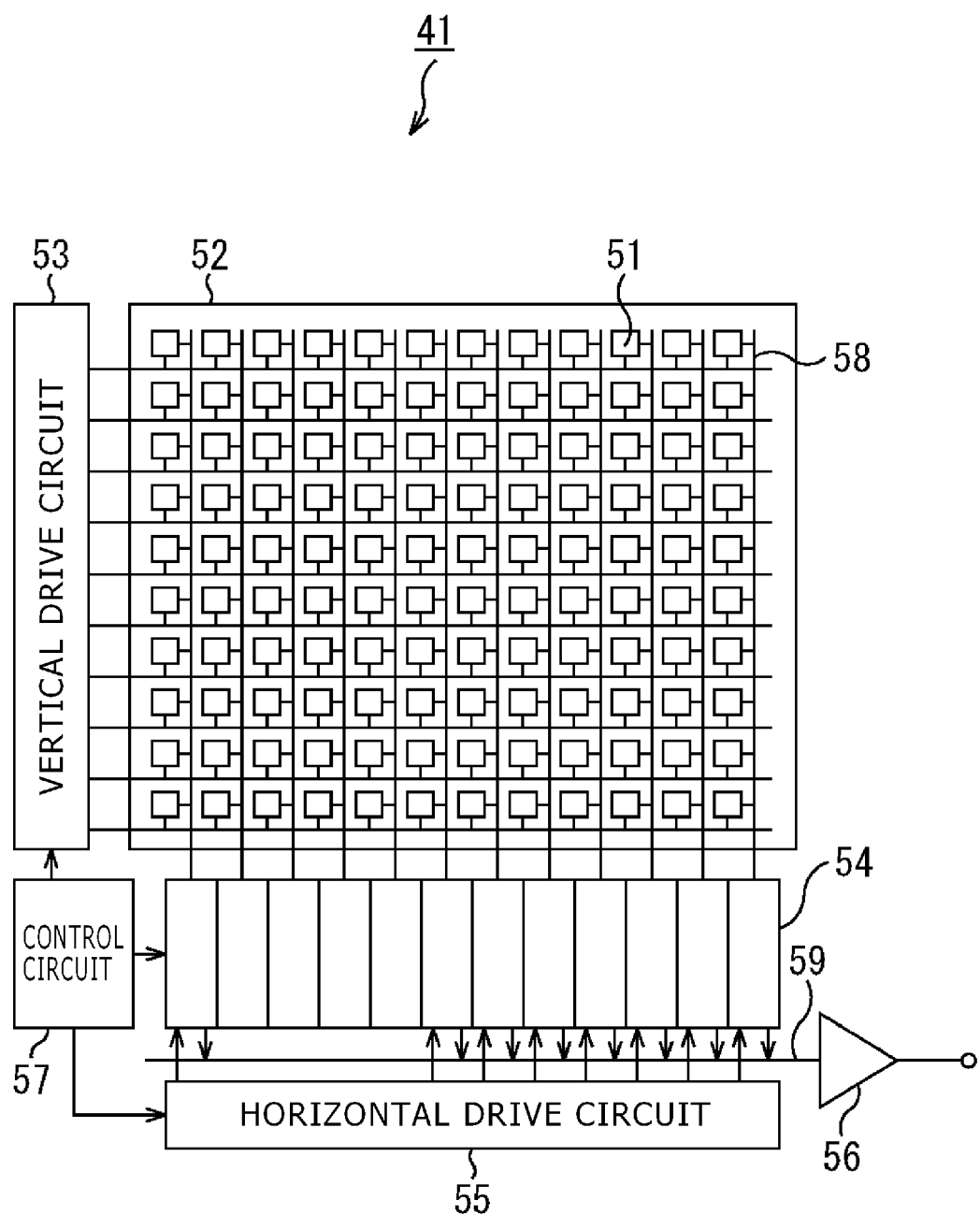
FIG. 4 is a schematic configuration view showing the whole part of a solid-state imaging device based on an embodiment of the present technology.

FIG. 4 is a schematic configuration view showing the whole part of a solid-state imaging device 41 based on an embodiment of the present technology. The solid-state imaging device 41 in FIG. 4 is, for example, a back-illuminated CMOS solid-state imaging device.

The solid-state imaging device 41 shown in FIG. 4 is configured to include a pixel region 52 including a plurality of pixels 51, a vertical drive circuit 53, column signal processing circuits 54, a horizontal drive circuit 55, an output circuit 56, a control circuit 57, etc.

The pixel 51 is configured to have a photodiode as a photoelectric conversion element, and a plurality of pixel transistors. The pixel transistors constituting the pixel 51 may be four pixel transistors of a transfer transistor, a reset transistor, a selection transistor and an amplification transistor. Alternatively, the pixel transistors may be the three transistors exclusive of the selection transistor.

In the pixel region 52, a plurality of the pixels 51 are orderly arranged in a two-dimensional matrix. In addition, the pixel region 52 includes an effective pixel region (not shown) by which signal charges generated through photoelectric conversion from actually received light are amplified and read into the column signal processing circuits 54, and a black reference pixel region (not shown) for outputting an optical black as a reference of black level. The black reference pixel region is normally formed in the periphery of the effective pixel region.

Based on a vertical synchronizing signal and a horizontal synchronizing signal and a master clock, the control circuit 57 generates a clock signal as a reference of operations of the vertical drive circuit 53, the column signal processing circuits 54 and the horizontal drive circuit 55, etc. and control signals and the like. The clock signal and the control signals and the like thus generated by the control circuit 57 are inputted to the vertical drive circuit 53, the column signal processing circuits 54 and the horizontal drive circuit 55, etc.

The vertical drive circuit 53 is composed, for example, of a shift register, by which the pixels 51 in the pixel region 52 are selectively scanned in the vertical direction sequentially on a row basis. In addition, the vertical drive circuit 53 supplies the column signal processing circuits 54 with image signals based on signal charges generated according to the quantities of light received at the photodiodes in the pixels 51, through vertical signal lines 58.

The column signal processing circuits 54 are arranged, for example, on the basis of each column of the pixels 51. The column signal processing circuits 54 operate so that signals outputted from the pixels 51 corresponding to one row are subjected to signal processing, such as noise removal and signal amplification, on a pixel column basis by a signal from the black reference pixel region. At output stages of the column signal processing circuits 54 are provided horizontal selection switches (not shown) between the column signal processing circuits 54 and a horizontal signal line 59.

The horizontal drive circuit 55 is composed, for example, of a shift register, by which horizontal scan pulses are outputted sequentially, whereby the column signal processing circuits 54 are sequentially selected and caused to output pixel signals to the horizontal signal line 59.

The output circuit 56 operates so that signals sequentially supplied from the column signal processing circuit 54 through the horizontal signal line 59 are subjected to signal processing, and the resultant signals are outputted.

Each of the pixels 51 in the solid-state imaging device 41 configured as above is composed of one of an R pixel, a G pixel, a B pixel and a W pixel. The R pixel is a pixel in which an R (red) color filter is disposed at an upper portion of a photodiode and which receives red light (light of red color component). Similarly, the G pixel and the B pixel are pixels for receiving green light and blue light, respectively. On the other hand, the W pixel is a pixel in which a white filter permitting transmission therethrough of light in the whole visible spectral range is disposed at an upper portion of a photodiode and which receives light in the whole visible spectral range. Provided with the W pixels in this manner, the solid-state imaging device 41 shows an enhanced sensitivity, as compared with an ordinary solid-state imaging device in which only R pixels, G pixels and B pixels are arranged.

[Example of Arrangement of White Filters]

FIG. 5 shows an example of arrangement of the white filters in the pixel region 52.

As shown in FIG. 5, the white filters 61 are arranged in a checked pattern, and the R, G or B color filters 15 are arranged in the remaining positions. The white filters 61 and the R, G or B color filters 15 are arranged adjacently to each other. Incidentally, when discriminating the R, G and B color filters 15 individually in the following description, the color filters will be referred to as color filters 15R, 15G and 15B. In addition, the pixel 51 in which the color filter 15R is disposed will be referred to as R pixel 51R; the pixel in which the color filter 15G is disposed will be referred to as G pixel 51B; the color filter 15B in which the color filter 15B is disposed will be referred to as B pixel 51B; and the pixel 51 in which the white filter 61 is disposed will be referred to as W pixel 51W.

In the example shown in FIG. 5, the number of the white filters 61 in the pixel region 52 is equal to the total number of the R, G and B color filters 15. Besides, the number of the G color filters 15G is equal to the total number of the R color filters 15R and the B color filters 15B. In addition, the size in plane directions (area) of the white filter 61 is the same as the size in plane directions (area) of each of the R, G and B color filters 15.

[Sectional View of W Pixel]

Figure 6:
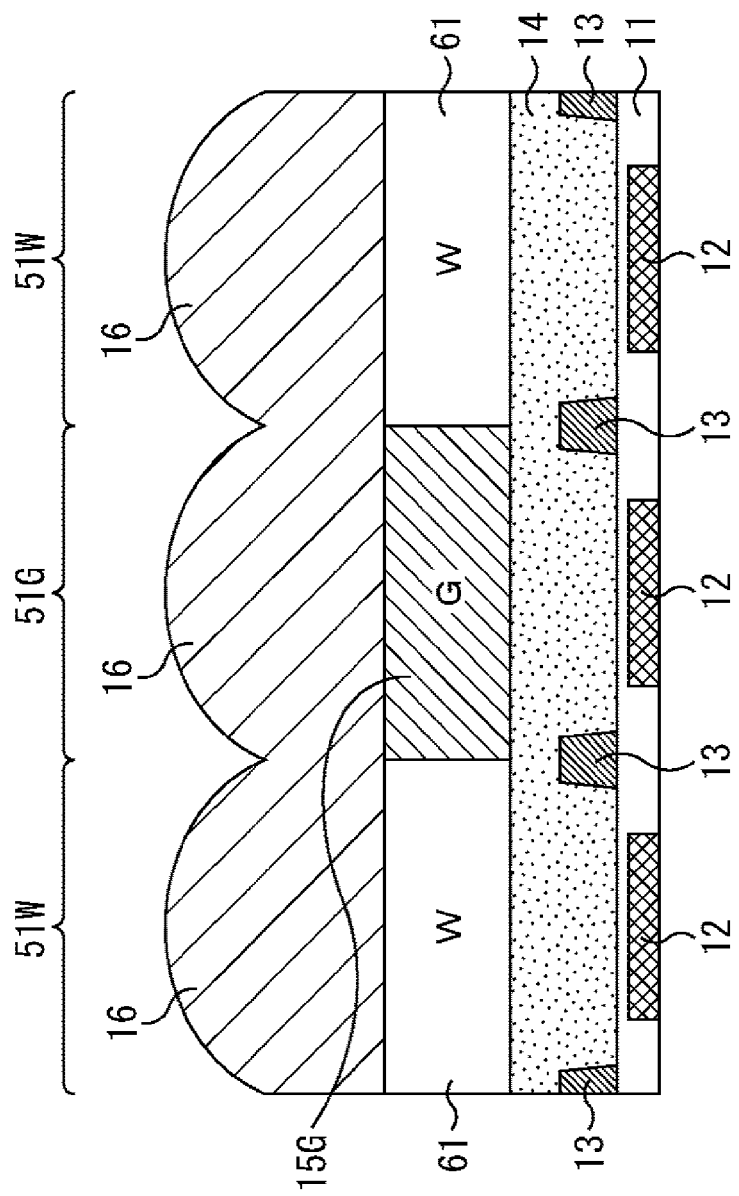
FIG. 6 shows a sectional view of a W pixel.

FIG. 6 shows a sectional view of three pixels 51 adjacent to one another in a horizontal direction in the pixel region 52, specifically, two W pixels 51W and one G pixel 51G disposed therebetween. Incidentally, the same parts as those in FIG. 1 are denoted by the same reference symbols as used in FIG. 1.

In FIG. 6, light receiving regions 12 composed of photodiodes are formed in a semiconductor substrate 11 such as a silicon substrate, on the basis of each of the pixels 51. On the semiconductor substrate 11, a light blocking film 13 is formed in each of boundary areas between the pixels 51. In addition, the semiconductor substrate 11 with the light blocking films 13 thereon is covered with a planarizing film 14.

Besides, on the planarizing film 14, a white filter 61 is formed in the region of the W pixel 51W, while a G color filter 15G is formed in the region of the G pixel 51G. Furthermore, microlenses 16 are formed on the white filters 61 and the color filter 15G, on the basis of each of the pixels 51.

Therefore, like the W pixel 1W shown in FIG. 1, the W pixel 51W is configured to have the light receiving region 12, the planarizing film 14, the white filter 61 and the microlens 16 stacked in this order from the side of the semiconductor substrate 11. However, the material for the white filter 61 is different from that for the white filter 15W in FIG. 1.

The white filter 61 is formed by use of a material prepared by adding particles of a metallic compound such as titanium compound, magnesium compound or aluminum compound to a copolymer resin such as acrylic resin, styrene resin or silane resin and dispersing the metallic compound particles in the copolymer resin. The addition and dispersion of the particles of the metallic compound into the material for the white filter 61 leads to a higher refractive index, as compared with the case where the metallic compound is not added. To be more specific, when the white filter 61 does not contain the metallic compound particles added and dispersed therein, its refractive index at a wavelength of 500 nm is about 1.50. On the other hand, when the white filter 61 contains the metallic compound particles added and dispersed therein, its refractive index at a wavelength of 500 nm is in the range of 1.54 to 2.00.

In other words, the refractive index of the G color filter 15G at a wavelength of 500 nm is in the range of 1.54 to 2.00; similarly, the refractive indices of the R color filter 15R and the B color filter 15B are also in the range of 1.54 to 2.00. In view of this, the material for the white filter 61 also contains particles of a metallic compound added to and dispersed therein so that the refractive index of the white filter 61 is comparable to those of the R, G and B color filters 15.

Figure 7:
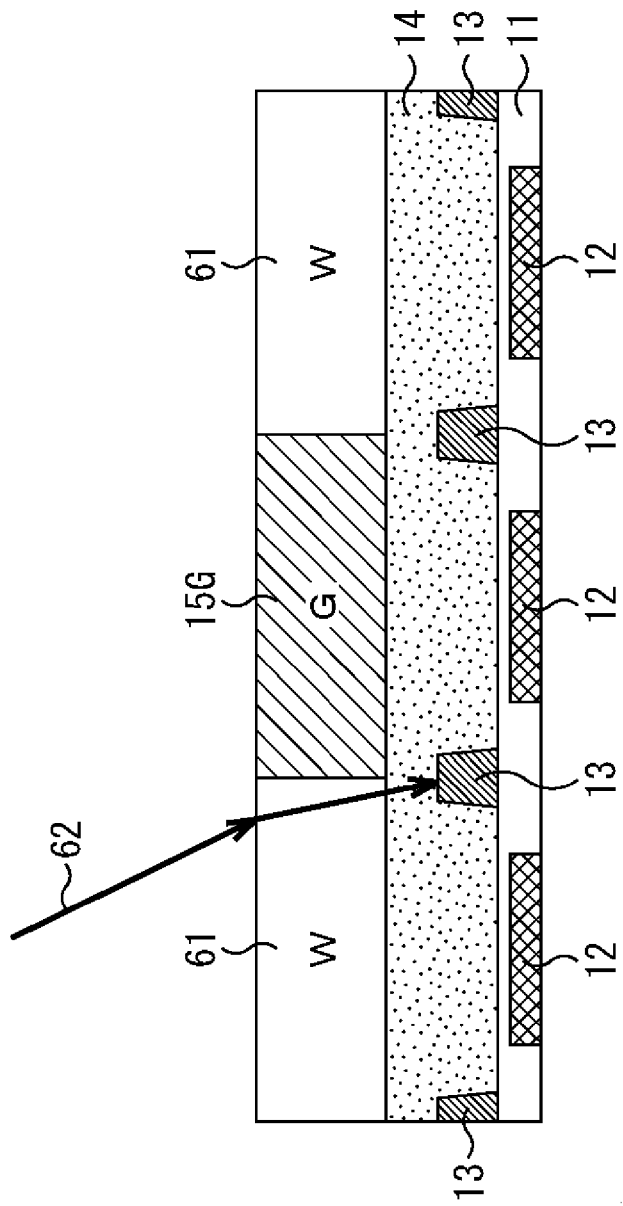
FIG. 7 illustrates an effect of the white filter shown in FIG. 6.

This results in that as shown in FIG. 7, light 62 incident on the W pixel 51W is refracted by the white filter 61, to be prevented from entering the adjacent G pixel 51G. Thus, the light 62 to be originally taken into the W pixel 51W can be prevented from being guided into the adjacent G pixel 51G. Similarly, the light to be taken into the G pixel 51G can be prevented from being led into the adjacent W pixel 1W. As a result, optical color mixing can be suppressed and color reproduction properties can be enhanced.

In addition, ordinary materials for the white filter 15W in the related art which do not contain a pigment or dye as color component keep a transmitting property for light in any wavelength region. Therefore, the resolving power (resolution) in photolithography applied to the white filter 15W is low, making it difficult to form fine pixel patterns. Besides, the absence of fine particles as color component in the material for the white filter 15W would increase reflow properties, so that thermal sagging would occur at pixel boundaries and the white filter 15W is liable to become lens-like in shape. In such an instance, it is practically difficult to form the white filter 15W into a rectangular shape as in FIG. 1.

The material used for forming the white filter 61 in FIG. 6 contains the particles of a metallic compound added thereto and dispersed therein. This leads to an enhanced resolving power in photolithography and enhanced thermal resistance at the time of post baking. Accordingly, the white filter 61 can be easily formed to be rectangular in shape.

This configuration will be compared with the configuration in the case where the white filter 15W is formed by embedding the material of the microlens 16, as shown in FIG. 2. In the configuration shown in FIG. 2, a difference in thermal coefficient of shrinkage would be generated between the white filter 15W and the color filter 15G. This leads to a problem in that, upon a high-temperature high-humidity repetition test as a reliability test before shipping of the solid-state imaging device, there is a high possibility of cracking of the microlens 16 in the boundary areas between the W pixel 1W and the G pixel 1G.

On the other hand, according to the configuration of the pixels 51 in FIG. 6, the material of the white filter 61 is a copolymer resin similar to those for the color filters 15. Therefore, the thermal coefficients of shrinkage of the white filter 61 and the color filter 15G are comparable, and, accordingly, it is possible to restrain the generation of cracking.

Furthermore, the above-mentioned material of the white filter 61 is also an organic material having photosensitivity (photosensitive resin), which enables easy pattern formation by photolithography.

Incidentally, inorganic materials such as SiON can also be used as the material for the white filter 61. In this case, however, there may arise the following problems. In forming the white filter 61 in a desired shape, patterning and dry etching by use of a photoresist would be needed, leading to an increased number of steps. In addition, upon generation of abnormality on a production basis, a reworking process (correcting process) may be impossible to carry out. Taking such demerits into account, it is desirable to use an organic material as above-mentioned.

Furthermore, a UV absorber capable of absorbing the i-line light (wavelength: 365 nm), for example, may be added to the material for the white filter 61. This makes it possible to exclude light of those wavelengths unnecessary for visible light. Also, it is made possible to enhance pattern resolution, since the light source for exposure is ordinarily a UV light source.

As for spectral characteristics of the white filter 61, it is desirable that the film thickness of the white filter 61 be 200 to 1,200 nm and that the transmittance in a wavelength range of 400 to 700 nm (visible spectral region) be not less than 90%. It should be noted here, however, that the transmittance may in some cases be lowered to below 90% by admixing the white filter material with carbon black, titanium black, dye, pigment or the like, for the purpose of, for example, preventing saturation due to the light coming from the W pixel 51W.

[Method of Producing Pixels]

Now, a method of manufacturing the pixels 51 will be described below, referring to FIGS. 8A to 8D.

Figure 8A:
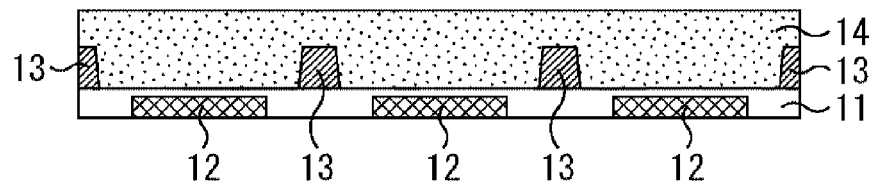
FIGS. 8A to 8D illustrate a method of producing pixels.

In a first step, as shown in FIG. 8A, light receiving regions 12 such as photodiodes are formed in a semiconductor substrate 11 such as silicon substrate by ion implantation, followed by forming a light blocking film 13 and a planarizing film 14. The light blocking film 13 is formed in each of boundary areas between the pixels 51 so that the light receiving regions 12 of the pixels 15 are opened. The refractive index of the planarizing film 14 is set to be in the range of 1.50 to 1.52 at a wavelength of 500 nm.

Figure 8B:
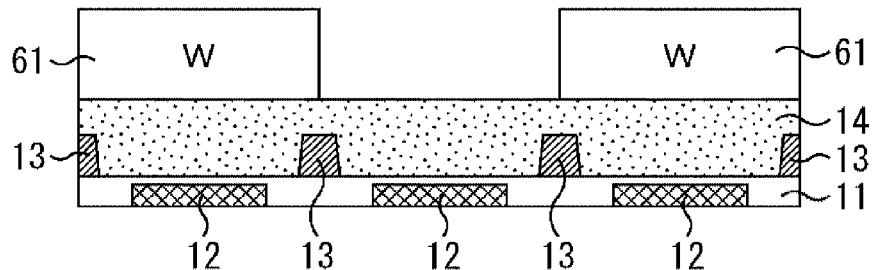

Next, in a second step, as shown in FIG. 8B, white filters 61 are formed in a checked pattern on the planarizing film 14. More specifically, the material for the white filter 61 which is also a photoresist is applied to the whole surface of the planarizing film 14. Thereafter, exposure and development are conducted through a photomask having a checked pattern corresponding to the arrangement of the W pixels 51W, whereby the white filters 61 are formed.

Figure 8C:
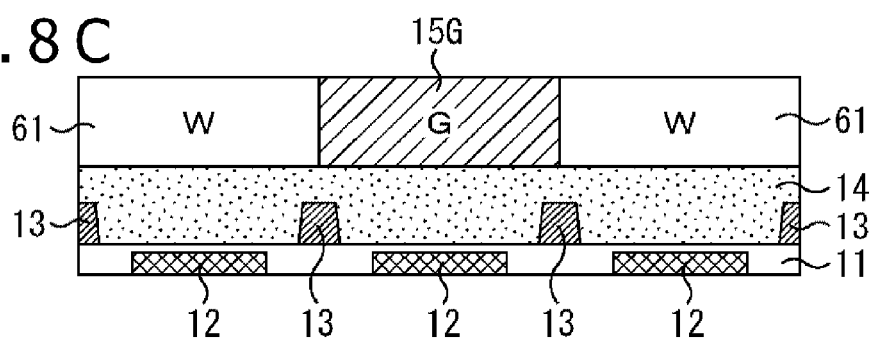

In a third step, as shown in FIG. 8C, G color filters 15G, R color filters 15R (not shown) or B color filters 15B (not shown) are formed in an arrangement as shown in FIG. 5 in those regions on the planarizing film 14 which correspond to the pixels 51 not provided with the white filter 61.

The white filters 61, the G color filters 15G, the R color filters 15R and the B color filters 15B may be formed in an arbitrary order. It is desirable, however, to form first the white filters 61 the number of pixels relevant to which is large. In the case of an arrangement as shown in FIG. 5, the R, G and B color filters 15 the numbers of pixels relevant to which are small are in sole or independent patterns, so that they are liable to peel. When the white filters 61 the number of pixels relevant of which is large are formed first, on the other hand, the peeling of the filters can be restrained or suppressed.

The refractive indices of the R, G and B color filters 15 at a wavelength of 500 nm are in the range of 1.54 to 2.00. In addition, as above-mentioned, the refractive index of the white filter 61 at a wavelength of 500 nm is also in the range of 1.54 to 2.00, a value comparable to those of the R, G and B color filters 15.

Figure 8D:
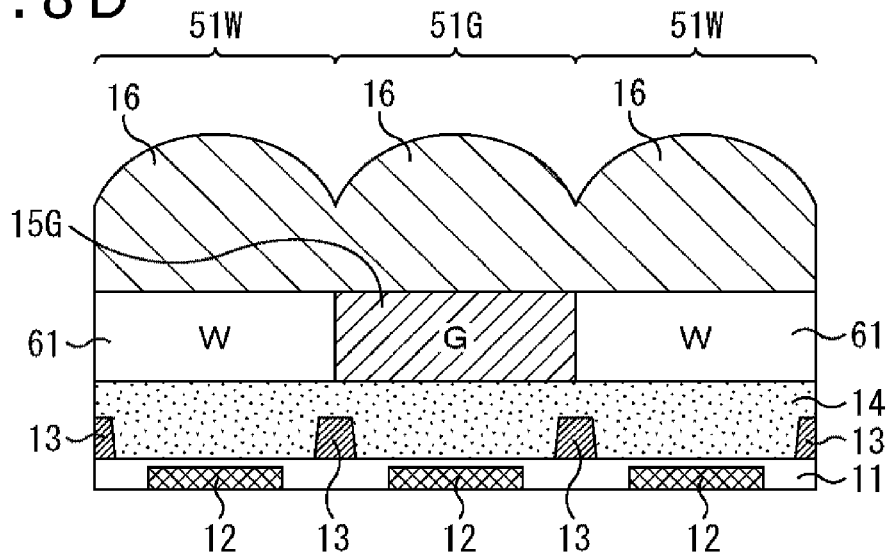

In a fourth step, as shown in FIG. 8D, microlenses 16 are formed on the white filters 61 and the R, G and B color filters 15. Specifically, a layer of a transparent material as the material for the microlenses 16 is formed on the filter layers, and, further, a thermally deformed resin layer formed in lens shapes by thermal reflow are transferred thereonto by dry etching, whereby the microlenses 16 are formed.

The refractive index of the microlenses 16 at a wavelength of 500 nm is set to be in the range of 1.54 to 1.65 so that it is higher than the refractive index of the planarizing film 14 and is not higher than the refractive indices of the filters (the white filters 61 and the R, G and B color filters 15).

In the solid-state imaging device 41, therefore, the filters and the microlenses 16 and the planarizing film 14 are so formed (produced) as to satisfy the relationship of: (Refractive indices of the filters, namely, the white filter 61 and the R, G and B color filters 15)≥(Refractive index of the microlenses 16)>(Refractive index of the pinarizing film 14). In addition, the refractive index of the white filter 61 is set to be closer to the refractive indices of the color filters 15 than to the refractive index of the microlens 16.

With the white filters 61 thus provided with the refractive index comparable to those of the R, G and B color filters 15, it is possible to enhance color reproduction properties, as described above referring to FIG. 7. In a back-illuminated CMOS solid-state imaging device, the distance from the light incidence surface to the light-receiving region 12 is short, and the angle relevant to collection of light by the microlens 16 is steep, so that color mixing into the W pixels is more liable to occur. Accordingly, the effect of the white filters 61 is more emphasized.

In the past, in a solid-state imaging device provided with W pixels, for instance, in Patent Document 1, the height of the microlens for the W pixel was set to be lower than that for the R, G and B pixels, so as to prevent light from being taken into the pixels adjacent to the W pixel. In addition, in Patent Document 2, the depth of the charge accumulation layer constituting the photodiode was varied to enhance the light collecting efficiency. These methods in the related art have had the problems of an increased number of steps, raised difficulty in formation of microlenses, and difficulty in adjusting the sensitivity characteristics between pixels.

In the solid-state imaging device 41 according to the embodiment of the present technology, the white filters 61 can be formed by the same process as for the R, G and B color filters 15, which promises an easy manufacturing process.

While the above embodiment has been described assuming that the solid-state imaging device 41 is a back-illuminated CMOS solid-state imaging device, the present technology can be applied also to front-illuminated solid-state imaging devices and CCD solid-state imaging devices. In addition, the present technology is also applicable to solid-state imaging device structured to have intra-layer lenses 71 as shown in FIG. 9, and to solid-state imaging devices configured to have waveguide structures 72 as shown in FIG. 10. The provision of the intra-layer lenses 71 or the waveguide structures 72 makes it possible to enhance the efficiency of collection of light into the light receiving regions 12 and to further enhance sensitivity characteristics. Naturally, a configuration wherein both the intra-layer lenses 71 and the waveguide structures 72 are provided may also be adopted in conjunction with the present technology.

Figure 11:
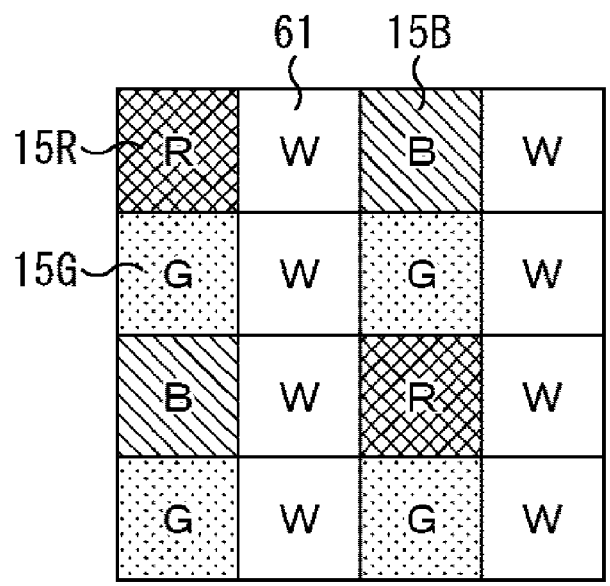
FIG. 11 shows another example of arrangement of white filters.
Figure 12:
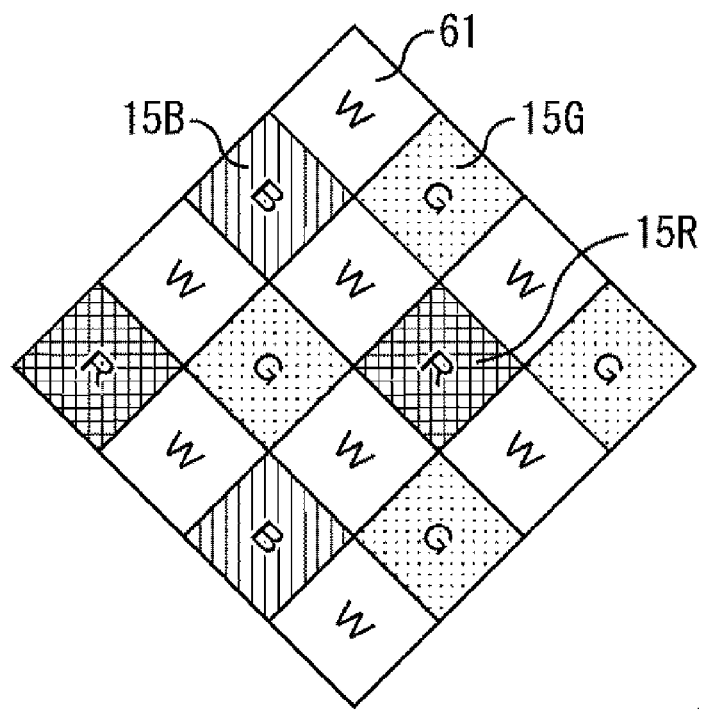
FIG. 12 shows a further example of arrangement of white filters.

Further, while an example in which the white filters 61 are arranged in a checked state as shown in FIG. 5 has been described in the embodiment above, the arrangement of the white filters 61 is not restricted to this one. For instance, a configuration wherein the white filters 61 are arranged in a striped pattern as shown in FIG. 11 can also be adopted. In addition, there can also be adopted a configuration wherein as shown in FIG. 12, the pixels 51 in the pixel region 52 are arranged with a 45-degrees rotation or angle relative to the horizontal or vertical direction and, accordingly, the white filters 61 and the R, G and B color filters 15 are also arranged with a 45-degrees rotation or angle.

Furthermore, the solid-state imaging device based on an embodiment of the present technology is required only to have the white filters 61 of the above-mentioned configuration together with other, color filters for at least one color. In addition, the colors of the other, color filters for at least one color are not restricted to the above-mentioned R, G or B. For example, there can be adopted a configuration wherein white filters 61 are provided together with magenta (Mg), cyan (Cy), yellow (Ye) and black (Bk) color filters, or a configuration wherein white filters 61 are provided together with magenta color filters.

In addition, while the size in plane directions (area) of the white filter 61 was the same as that of each of the R, G and B color filters 15 in the above-described embodiment, it may be smaller than this. When the size in the plane directions of the white filter 61 is set to be smaller than that of the other, color filters, the region permitting transmission therethrough of light in a wide wavelength region is narrowed; consequently, color mixing can be prevented more securely.

[Example of Application to Electronic Apparatus]

The solid-state imaging device 41 as above-described is applicable to various electronic apparatuses, for example, imaging equipment such as digital still cameras and digital video cameras, mobile phones having an imaging function, or other apparatuses having an imaging function.

Figure 13:
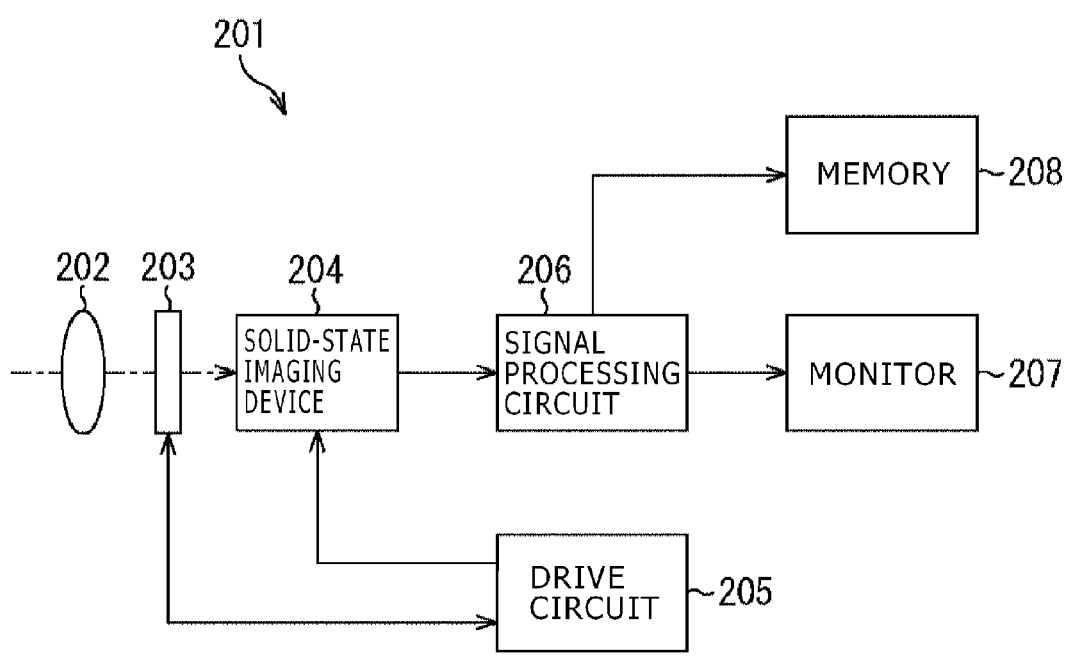
FIG. 13 is a block diagram showing an example of the configuration of imaging equipment as an electronic apparatus based on an embodiment of the present technology.

FIG. 13 is a block diagram showing an example of the configuration of imaging equipment as an electronic apparatus based on an application of the present technology.

The imaging equipment 201 shown in FIG. 13 includes an optical system, a shutter device 203, a solid-state imaging device 204, a drive circuit 205, a signal processing circuit 206, a monitor 207 and a memory 208, and can pick up still images and moving images.

The optical system 202 is configured to have a lens or a plurality of lenses. By the optical system 202, light (incident light) from a subject is guided to the solid-state imaging device 204, to cause an image to be formed on a light receiving plane (light receiving region 12) of the solid-state imaging device 204.

The shutter device 203 is disposed between the optical system 202 and the solid-state imaging device 204. According to control by the drive circuit 205, the shutter device 203 controls a light illumination period and a light blocking period for the solid-state imaging device 204.

The solid-state imaging device 204 is composed of the above-described solid-state imaging device 41. The solid-state imaging device 204 accumulates signal charges for a predetermined period, according to the light focused to form the image on the light receiving plane through the optical system 202 and the shutter device 203. The signal charges accumulated in the solid-state imaging device 204 are transferred according to a drive signal (timing signal) supplied from the drive circuit 205. The solid-state imaging device 204 may be configured alone as one chip, or may be configured as a part of a camera module by being packaged together with the optical system 202 and the signal processing circuit 206, etc.

The drive circuit 205 outputs drive signals for controlling a transferring operation of the solid-state imaging device 204 and a shutter operation of the shutter device 203, thereby driving the solid-state imaging device 204 and the shutter device 203.

The signal processing circuit 206 applies various signal processings to the signal charges outputted from the solid-state imaging device 204. An image (image data) obtained by the signal processings conducted by the signal processing circuit 206 is supplied to or displayed on the monitor 207, or is supplied to and stored (recorded) in the memory 208.

In the imaging equipment 201 configured as above-mentioned, the above-described solid-state imaging device 41 enhanced in color reproduction properties is applied as the solid-state imaging device 204, whereby image quality can be enhanced.

The embodiment of the present technology is not restricted to the above-described embodiment, and various modifications are possible within the scope of the gist of the present technology.

Incidentally, the present technology can assume the following configurations.

(1)
A solid-state imaging device including
a plurality of pixels arranged two-dimensionally,
wherein the pixels each have at least
a planarizing film formed on the upper side of a photoelectric conversion element,
a filter formed on the upper side of the planarizing film, and
a microlens formed on the upper side of the filter;
the filters of a part of the pixels are each a color filter permitting transmission therethrough of light of a predetermined color component, whereas the filters of another part of the pixels are each a white filter permitting transmission therethrough of light in the whole visible spectral range; and
the refractive indices of the white filter, the microlens and the planarizing film are in the following relationship:

(Refractive index of white filter)≥(Refractive index of microlens)>(Refractive index of planarizing film).

(2)
The solid-state imaging device according to the above paragraph (1),
wherein the refractive index of the white filter is closer to the refractive index of the color filter than to the refractive index of the microlens.

(3)
The solid-state imaging device according to the above paragraph (1) or (2),
wherein the pixels having the white filter and the pixels having the color filter are arranged adjacently to each other.

(4)
The solid-state imaging device according to the above paragraph (3),
wherein the pixels having the white filter are arranged in a checked pattern, and the pixels having the color filter are disposed in the remaining positions.

(5)
The solid-state imaging device according to any of the above paragraphs (1) to (4),
wherein the refractive index of the white filter at a wavelength of 500 nm is in the range of 1.54 to 2.00.

(6)
The solid-state imaging device according to any of the above paragraphs (1) to (5),
wherein the while filter is formed by use of a material obtained by adding a metallic compound to a copolymer resin.

(7)
The solid-state imaging device according to the above paragraph (6),
wherein a UV absorber is further added to the material for the white filter.

(8)
A method of manufacturing a solid-state imaging device which includes a plurality of pixels arranged two-dimensionally, the pixels each having at least a planarizing film formed on the upper side of a photoelectric conversion element, a filter formed on the upper side of the planarizing film, and a microlens formed on the upper side of the filter, and
in which the filters of a part of the pixels are each a color filter permitting transmission therethrough of light of a predetermined color component, whereas the filters of another part of the pixels are each a white filter permitting transmission therethrough of light in the whole visible spectral range,
the method including forming the pixels by using as materials for the planarizing film, the white filter and the microlens those materials which satisfy the following relationship:

(Refractive index of white filter)≥(Refractive index of microlens)>(Refractive index of planarizing film).

(9)
The method according to the above paragraph (8),
wherein the color filters include at least one kind of color filters; and
in forming the filters, those of the white filters and the at least one kind of color filters which are greater in the number of pixels are formed first, and thereafter the remaining filters are formed.

(10)

An electronic apparatus including
a solid-state imaging device,
the solid-state imaging device including a plurality of pixels arranged two-dimensionally,
wherein the pixels each have at least
a planarizing film formed on the upper side of a photoelectric conversion element,
a filter formed on the upper side of the planarizing film, and
a microlens formed on the upper side of the filter;
the filters of a part of the pixels are each a color filter permitting transmission therethrough of light of a predetermined color component, whereas the filters of another part of the pixels are each a white filter permitting transmission therethrough of light in the whole visible spectral range; and
the refractive indices of the white filter, the microlens and the planarizing film are in the following relationship:

(Refractive index of white filter)≥(Refractive index of microlens)>(Refractive index of planarizing film).

(11)

A composition for a solid-state imaging device, the composition including a copolymer resin, a metallic compound and a UV absorber, having a refractive index at a wavelength of 500 nm in the range of 1.54 to 2.00, and permitting transmission therethrough of light in the whole visible spectral range.

The present disclosure contains subject matter related to that disclosed in Japanese Priority Patent Application JP 2011-262102 filed in the Japan Patent Office on Nov. 30, 2011, the entire content of which is hereby incorporated by reference.

What is claimed is:

1. A solid-state imaging device comprising a plurality of pixels arranged two-dimensionally, each of the pixels having at least:
a planarizing film formed on the upper side of a photoelectric conversion element,
a filter formed on the upper side of the planarizing film, and
a microlens formed on the upper side of the filter,
wherein,
the filters of a part of the pixels are each a color filter permitting transmission therethrough of light of a predetermined color component, whereas the filters of another part of the pixels are each a white filter permitting transmission therethrough of light in the whole visible spectral range, and
the refractive indices of the white filter, the microlens and the planarizing film are in the relationship: Refractive index of white filter)≥(Refractive index of microlens)>(Refractive index of planarizing film).

2. The solid-state imaging device according to claim 1, wherein the refractive index of the white filter is closer to the refractive index of the color filter than to the refractive index of the microlens.

3. The solid-state imaging device according to claim 1, wherein the pixels having the white filter and the pixels having the color filter are arranged adjacently to each other.

4. The solid-state imaging device according to claim 3, wherein the pixels having the white filter are arranged in a checked pattern, and the pixels having the color filter are disposed in the remaining positions.

5. The solid-state imaging device according to claim 1, wherein the refractive index of the white filter at a wavelength of 500 nm is in the range of 1.54 to 2.00.

6. The solid-state imaging device according to claim 1, wherein the while filter is formed by use of a material obtained by adding a metallic compound to a copolymer resin.

7. The solid-state imaging device according to claim 6, wherein a UV, ultra-violet absorber is further added to the material for the white filter.

* * * * *